United States Patent
Bjorksten et al.

(10) Patent No.: US 6,552,676 B1
(45) Date of Patent: Apr. 22, 2003

(54) METHOD AND APPARATUS FOR POWER REDUCTION IN SWITCHED CAPACITOR CIRCUITS

(75) Inventors: Patrik Bjorksten, Helsingfors (FI); Sami Kallioinen, Espoo (FI); Jukka Wallinheimo, Helsinki (FI); Tom Ahola, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 09/951,707

(22) Filed: Sep. 14, 2001

(51) Int. Cl.[7] .............................................. H03M 3/02
(52) U.S. Cl. ...................................... 341/143; 341/118
(58) Field of Search ........................ 363/19, 20; 330/9, 330/107, 109, 51; 341/172, 173, 143, 118

(56) References Cited

U.S. PATENT DOCUMENTS

| | | | | |
|---|---|---|---|---|
| 4,908,579 A | * | 3/1990 | Tawflk et al. ............... 328/167 |
| 5,142,238 A | * | 8/1992 | White ............................ 330/9 |
| 5,177,484 A | * | 1/1993 | Briickmann ................. 341/172 |
| 5,293,169 A | * | 3/1994 | Baumgratner et al. ....... 341/172 |
| 5,319,289 A | * | 6/1994 | Austin et al. ................ 318/254 |
| 5,327,092 A | * | 7/1994 | Inogai et al. ................ 328/167 |

* cited by examiner

*Primary Examiner*—Rajnikat B. Patel
(74) *Attorney, Agent, or Firm*—Antonelli, Terry, Stout & Kraus, LLP

(57) ABSTRACT

Method and apparatus for reducing power in a switched capacitor circuit. In one embodiment, the power reduction apparatus includes a detector connected to both inputs of an operational amplifier in a switched capacitor circuit, and a controller. The detector monitors the inputs. A voltage corresponding to full settling (i.e. a zero difference between the inputs) is stored. The voltage corresponding to the difference between the inputs is compared to the previous value to determine whether it is within the desired range. The controller is connected to an output signal of the detector. The controller adjusts a bias current of the operational amplifier based on the output signal to as low as possible but just above a value where the comparison falls outside the desired range. The power consumption of the operational amplifier is minimized while a settling time of the operational amplifier is still adequate for maximum performance.

20 Claims, 4 Drawing Sheets

SIGMA-DELTA MODULATOR PERFORMANCE WITH DIFFERENT BIAS CURRENTS

SC FILTER PERFORMANCE WITH DIFFERENT BIAS CURRENTS

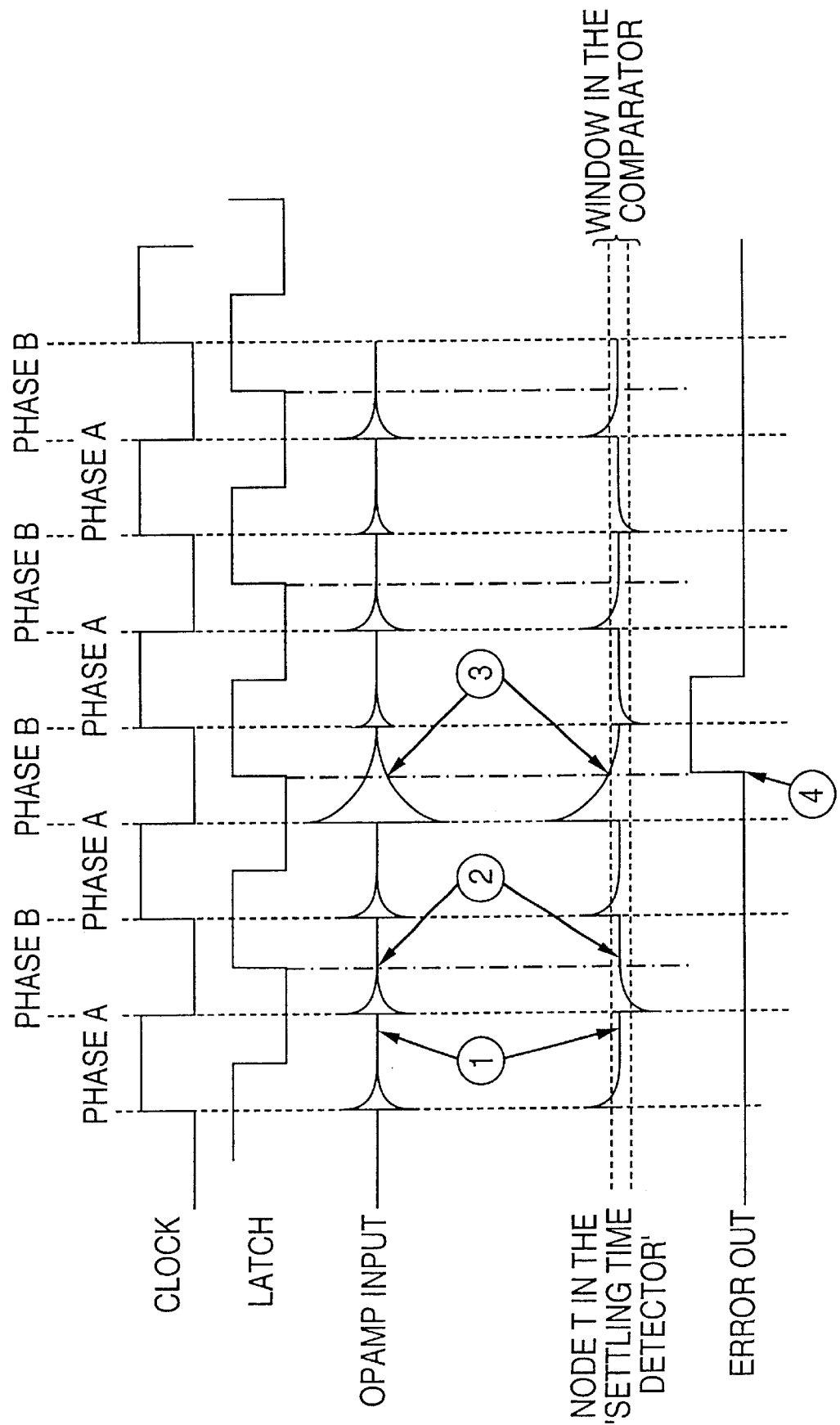

METHOD AND APPARATUS FOR POWER REDUCTION IN SWITCHED CAPACITOR CIRCUITS

BACKGROUND

1. Field of the Invention

This invention relates to switched capacitor circuits, and more specifically to methods and apparatus for power reduction in switched capacitor circuits.

2. Background Information

Switched capacitor (SC) circuits are often used in both analog-to-digital convertors (ADC) and in digital-to-analog convertors (DAC) as well as in filters in telecommunication integrated circuits. The basic building blocks of SC-circuits are capacitors, switches and operational amplifiers (opamps). The operational amplifiers are responsible for most of the current consumption in SC-circuits. The operational amplifiers need to be designed so that they can transfer the desired charge between the capacitors through the switches in all conditions during the selected clocking period. The charge transfer requirements in a switched capacitor circuit sets the gain, bandwidth, and slew rate requirements for the operational amplifier. The settling time of the operational amplifier is primarily determined by its bandwidth and slew rate, which determine the current consumption of the operational amplifier. Higher bandwidth and slew rate results in higher current consumption and consequentially higher total power consumption. These requirements are fulfilled for all possible worst case scenarios in simulations, and hence, the opamps are almost always designed for tougher requirements than actually needed. Changing the bias current of the operational amplifier can change the bandwidth and slew rate.

As a switched capacitor circuit is manufactured, there is no perfect control on process conditions, and thus all components in the switched capacitor circuit have statistical variation in their performance. During the design phase, this variation is estimated and thus operational amplifiers are designed so that they meet the settling requirements in the worst-case conditions. Otherwise, the yield can be low. Designing operational amplifiers with the worst-case conditions means high bandwidth and slew rate requirements and thus high power consumption. If the fabricated chip happens to be more average than a worst-case condition chip, extra power is being spent as the switched capacitor circuits on the chip would work with less power and still meet desired performance specifications.

Therefore, a need exists for reducing power in switched capacitor circuits while still keeping the performance of the circuit as close as possible to its maximum.

SUMMARY OF THE INVENTION

The present invention is directed to a power reduction device for a switched capacitor circuit that includes a detector and a controller. The detector is connected to both inputs of an operational amplifier in a switched capacitor circuit. The detector monitors the inputs during each clock phase. During every second clock phase a voltage corresponding to full settling (i.e. a zero difference between the inputs) is stored at the end of the clock phase. During the next clock phase the voltage corresponding to the difference between the inputs is compared to the previous value before the end of the clock phase to determine whether it is within the desired range. The controller is connected to an output signal of the detector. The controller adjusts a bias current of the operational amplifier based on the output signal. The bias current is adjusted to as low as possible but just above a value where the comparison falls outside the desired range. The power consumption of the operational amplifier is minimized while a settling time of the operational amplifier is still adequate for maximum performance.

The present invention is also directed to a method for power reduction in a switched capacitor circuit that includes: applying a full bias current level to an operational amplifier; monitoring a settling time of the operational amplifier at the inputs of the operational amplifier; determining if a voltage difference between the inputs is above a threshold; lowering the bias current level for the operational amplifier if the voltage difference between the inputs is below the threshold; repeating the monitoring, determining, and lowering until the voltage difference between the inputs is above the threshold; and setting the bias current level to a previous bias current level before the bias current level where the voltage difference between the inputs is above the threshold. The power consumption of the operational amplifier is minimized while the settling time of the operational amplifier is still adequate for maximum performance.

The present invention is further directed to a power reduction device for a switched capacitor circuit that includes a counter, bias control logic, and a controller. The counter monitors output signals of a switched capacitor circuit. The bias control logic controls a bias current level of at least one operational amplifier in the switched capacitor circuit. The controller is connected to the counter and the bias control logic. The controller sends signals instructing the bias control logic to increase or decrease the bias level current to the at least one operational amplifier based on the accuracy of the monitored output signals. The power consumption of the operational amplifier is minimized while maintaining maximum performance from the operational amplifier.

Moreover, the present invention is directed to a method for power reduction in a switched capacitor circuit that includes: monitoring an output of the switched capacitor circuit; controlling a bias current level of at least one operational amplifier in the switched capacitor circuit; and increasing or decreasing the bias level current to the at least one operational amplifier based on the accuracy of the monitored output signal. The power consumption of the operational amplifier is minimized while maintaining maximum performance from the operational amplifier.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein:

FIG. 6 is a timing diagram of a power reduction circuit and operational amplifier according to an example embodiment of the present invention.

DETAILED DESCRIPTION

Figure 1:
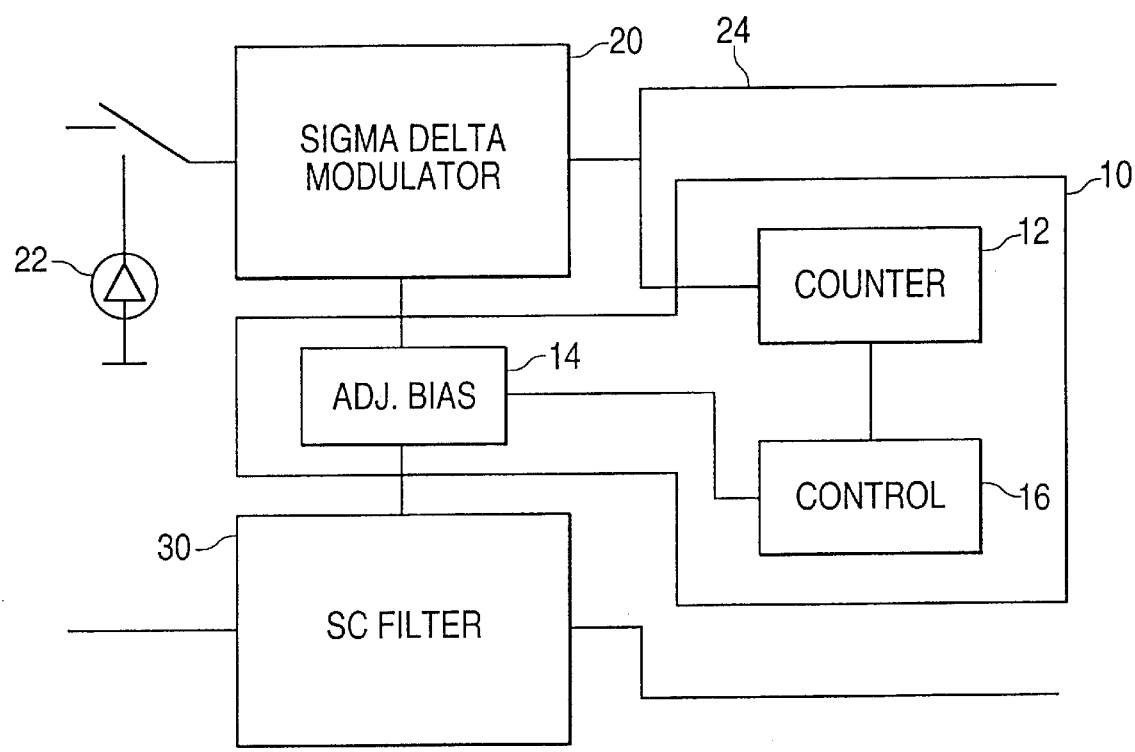
FIG. 1 is a block diagram of a current reduction device for switched capacitor circuits according to an example embodiment of the present invention.

The particulars shown herein are by way of example and for purposes of illustrative discussion of the embodiments of the present invention. The description taken with the drawings make it apparent to those skilled in the art how the present invention may be embodied in practice.

Further, arrangements may be shown in block diagram form in order to avoid obscuring the invention, and also in view of the fact that specifics with respect to implementation of such block diagram arrangements is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that any combination of hard-wired circuitry and software instructions can be used to implement embodiments of the present invention, i.e., the present invention is not limited to any specific combination of hardware circuitry and software instructions.

Although example embodiments of the present invention may be described using an example system block diagram in an example host unit environment, practice of the invention is not limited thereto, i.e., the invention may be able to be practiced with other types of systems, and in other types of environments.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

The present invention relates to methods and apparatus for power reduction in switched capacitor circuits that reduces a bias current level supplied to operational amplifiers in switched capacitor circuits to a minimum level while still maintaining optimal operational amplifier performance. A calibration process may be performed every time before the switched capacitor circuit is used to determine how low the bias current level may be set before switched capacitor circuit errors start to occur. Once the amount of errors increases beyond a desired or tolerable maximum, the bias current may be set to a level just above where the amount of errors rose above the maximum, thus bringing the number of errors within a tolerable level. This bias level represents a minimum bias current level possible while still maintaining optimal performance from the operational amplifiers and switched capacitor circuit.

Once a bias level for a switched capacitor circuit has been determined whereby optimal performance is achieved while using minimal amount of power (i.e., bias level current), other switched capacitor circuits on the same integrated circuit chip may be biased using this same bias level current. In another embodiment, each individual operational amplifier and each in every switched capacitor circuit may be calibrated individually and, therefore, have its own specific bias current level. Moreover, the monitoring of errors can occur at the output of a switched capacitor circuit, or at the input of each individual operational amplifier that is a part of the switched capacitor circuit by monitoring operational amplifier settling time.

FIG. 1 shows a block diagram of a current reduction device for switched capacitor circuits according to an example embodiment of the present invention. Current reduction device 10 may include a counter 12, adjustable bias logic 14, and controller 16. Bias logic 14 may be connected to one or more switched capacitor circuits 20, 30. In this example embodiment, switched capacitor circuit 20 is a sigma delta (also known as delta sigma) modulator and switched capacitor circuit 30 is a switched capacitor (SC) filter. However, adjustable bias logic 14 and power reduction device 10 may be connected to any switched capacitor circuit and still be within the spirit and scope of the present invention. Counter 12 may be connected to the output of one switched capacitor circuit 20 of several switched capacitor circuits on a chip. Counter 12 monitors the output of sigma delta modulator 20. Controller 16 receives inputs from counter 12. Based on the inputs received form counter 12, controller 16 generates signals instructing adjustable bias logic 14 whether to increase or decrease the bias current level to switched capacitor circuit 20.

Before sigma delta modulator 20 is used to perform its duty as part of another circuit (e.g., analog-to-digital converter), sigma delta modulator 20 may be calibrated by adjusting the bias current so that the required accuracy is obtained. All other switched capacitor circuits on the same monolithic chip, for example SC filter 30, may be operated with a bias current that is reduced to the same fraction (or a little less because there is no corrected feedback in most of the SC circuits) as the sigma delta modulator 20 bias current due to the fact that the components are in the same process case.

To measure the performance, the bit stream output of sigma delta modulator 20 may be simply monitored for a period of time by counter 12. If the bias current is too low, the output of modulator 20 may not alternate as much as it may during normal operation. This can be easily determined. For example, DC voltage source 22 may be set to be in the middle of the normal operating range. In this case, it is expected that one half of the signals from the output 24 of sigma delta modulator 20 should be '0's, and one half of the output signals be '1's, in an alternating pattern. Counter 12 may monitor this output string and count the number '1's during a set number of clock cycles. If the number of '1's is accurate, this may be reported to controller 16 which in turn may send signals to bias logic 14 to decrease the bias current level being supplied to sigma delta modulator 20. This decrease in bias current level may cause the accuracy at the output 24 of sigma delta modulator 20 to now decrease.

This process may be repeated until the accuracy at the output 24 of sigma delta modulator 20 falls below a desired or tolerable maximum. At this point, bias logic 14 may be instructed by controller 16 to increase the bias current to a level just before the accuracy fell below the tolerable maximum. This bias current level may then be the bias current used for sigma delta modulator 20 where sigma delta modulator 20 operates using a minimal amount of power while maintaining optimal performance. As noted previously, this same current may also be used for other switched capacitor circuits on the same monolithic chip. Therefore, there may be no need to perform the same calibration process for each switched capacitor circuit on the same monolithic chip. However, using the same bias current level for other circuits assumes the use of the same type operational amplifiers and the same relative loading on the outputs of the operational amplifiers. Therefore use of the same current level may be more of an approximation of the lowest current level useable by other switched capacitor circuits on the same monolithic chip while still maintaining optimal performance.

In another alternative slower method to measure the performance, during the calibration phase, the sigma delta modulator 20 and a counter may form a so called single shot sigma delta converter. This simple converter measures a DC voltage that is switched to the input basically by counting the amount of one bits during the measurement. The single shot sigma delta converter may be used to find a digital word describing the measured voltage value and an additional random error term that is relative to the biasing current. If several measurements are performed, it can be easily determined which bits in the digital word are stable and which are changing randomly. If more stability in the bits is desired (i.e., an increase in the accuracy of the converter), the bias current level may be increased. On the other hand, if less accuracy can be tolerated, the bias current level may be reduced and thus reduce the power consumption of the switched capacitor circuit (sigma delta modulator 20). Temperature changes may cause a need for a new calibration round.

Figure 2:
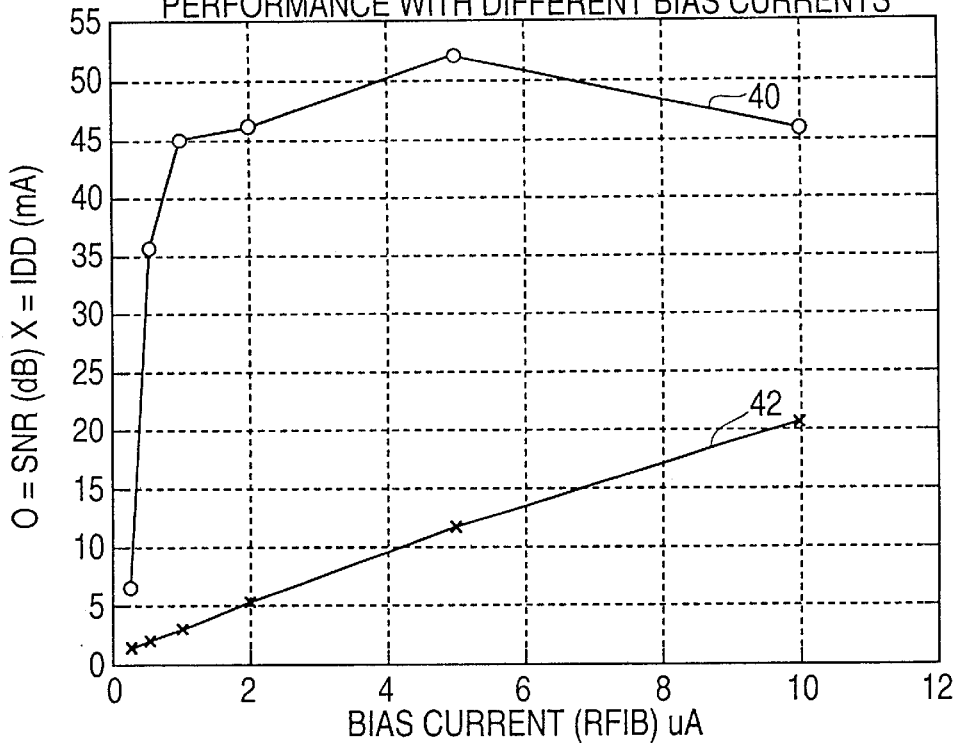
FIG. 2 is a plot of signal to noise ratio/total current versus bias current in a switched capacitor circuit according to an example embodiment of the present invention.

FIG. 2 shows a plot of signal to noise ratio/total current versus bias current in a switched capacitor circuit according to an example embodiment of the present invention. The top plot 40 represents a curve of the signal to noise ratio (SNR) of a sigma delta modulator as the bias current is increased. The SNR represents the performance of the switched capacitor circuit. The X axis of the plot represents the bias current sent to a switched capacitor circuit, as measured in microamperes for example. The Y axis represents both signal to noise ratio in decibels (dB) and total current consumption of the switched capacitor circuit (IDD) in milliamperes.

The bottom curve 42 shows the total current of a switched capacitor circuit, IDD, versus the bias current being applied. As can be seen from the top plot 40, individual switched capacitor circuits may be operated quite well with one fifth of the power consumption. For example, a bias current of 10 microamps may result in a total current of 20 milliamps being consumed, and may achieve a signal to noise ratio of roughly 45 dB. Approximately this same performance, 45 dB, may also be achieved with significantly less bias current. For example, a bias current of 2 microamps results in less total current, 5 milliamps, which relates to less power consumption. Therefore, according to the present invention, the bias current for a switched capacitor circuit may be adjusted to a minimal level and the switched capacitor circuit still achieve the same performance, therefore, allowing reduction of the power consumed by the switched capacitor circuit.

Figure 3:
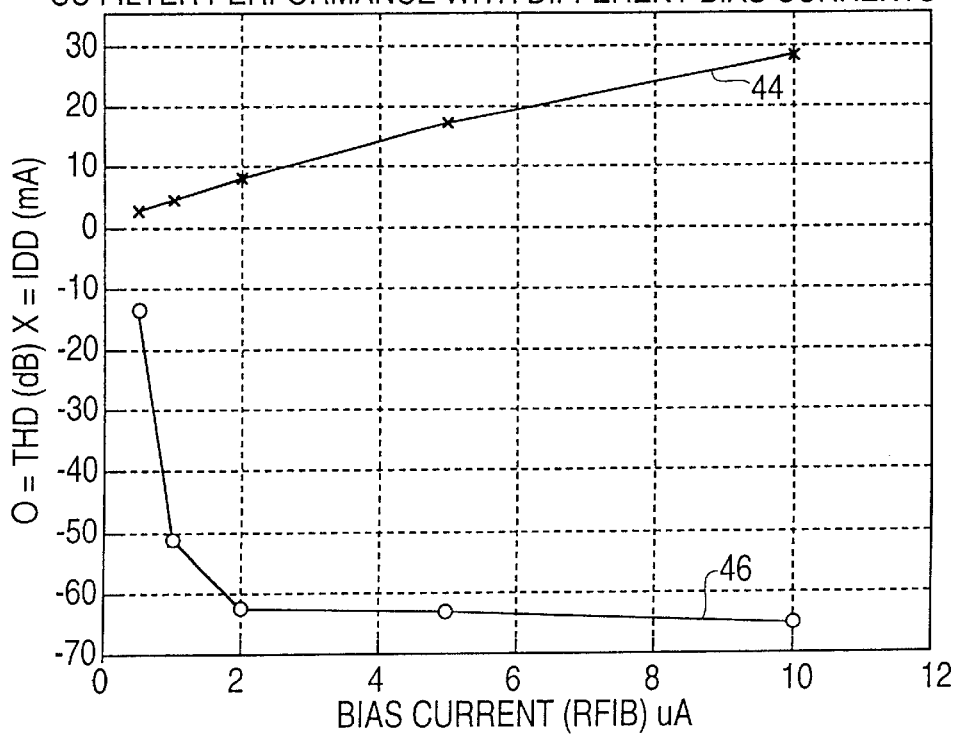
FIG. 3 is a plot of total harmonic distortion (THD) as it relates to bias current.

FIG. 3 shows a plot of total harmonic distortion (THD) as it relates to bias current. The plot 44 shows how the total harmonic distortion decreases with decreasing bias current. Plot 46 at the bottom of FIG. 3 shows how the bias current can be decreased. Therefore, the total harmonic distortion decreases with decreasing bias current.

Figure 4:
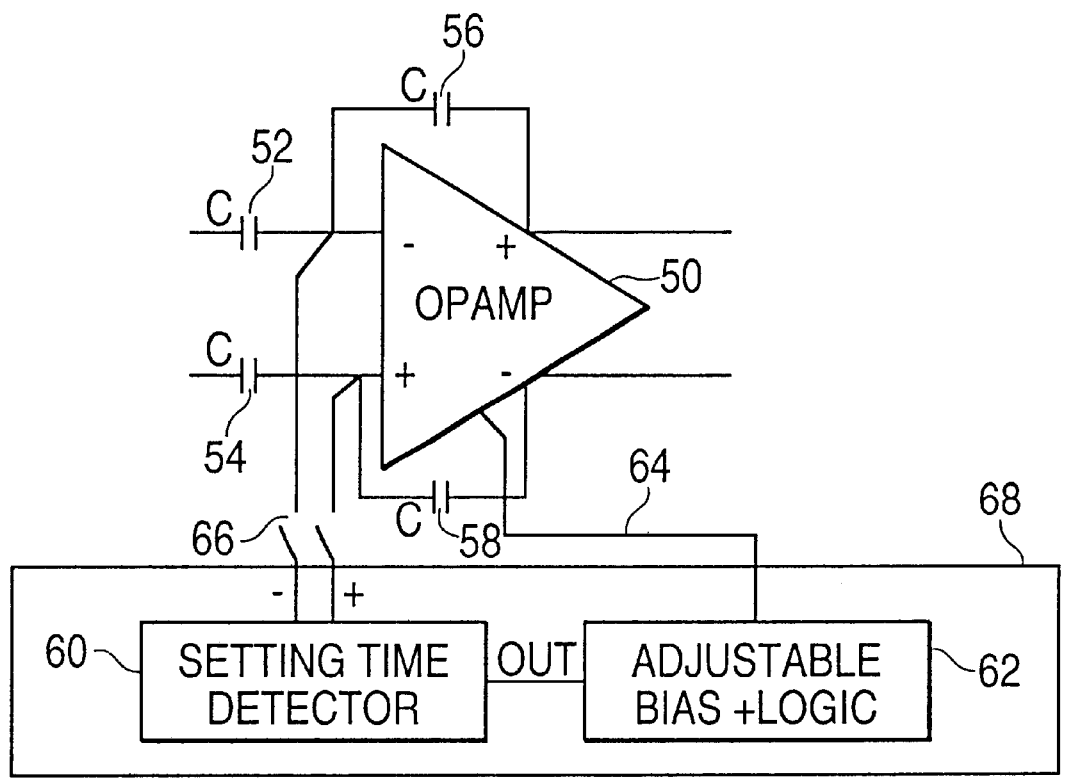
FIG. 4 is a power reduction device for switched capacitor circuits according to a second embodiment of the present invention.

FIG. 4 shows a power reduction device for switched capacitor circuits according to a second embodiment of the present invention. Power reduction device 68 may be connected to an operational amp 50 that may be one of many operational amplifiers that are part of a switched capacitor circuit. Operational amplifier 50 has sampling capacitors 52 and 54 on its inverting and non-inverting inputs, respectively. Further, integration capacitor 56 may be connected between the non-inverting output of operational amplifier 50 and the inverting input of operational amp 50. Similarly, integration capacitor 58 may be connected between the inverting output of operational amplifier 50 and the non-inverting input of operational amp 50. Power reduction device 68 monitors the inputs of operational amplifier 50 by connecting these inputs to a settling time detector 60 within power reduction device 68. A switching device 66 may connect settling time detector 60 to the inputs of operational amplifier 50 during monitoring, and disconnect settling time detector 60 from the inputs when monitoring it is not desired. Power reduction device 68 may also include bias logic 62 that adjusts and controls a bias current level supplied to operational amplifier 50 via signal line 64.

Figure 5:
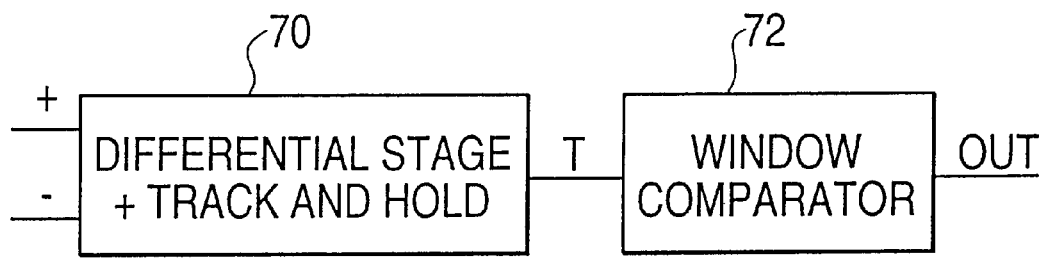
FIG. 5 is a block diagram of a settling time detector according to an example embodiment of the present invention.

FIG. 5 shows a block diagram of a settling time detector according to an example embodiment of the present invention. This example settling time detector may include a differential stage and track and hold circuit 70. An output T of differential stage and track and hold circuit 70 may be connected to a window comparator 72. The differential stage has a high impedance input. Since the detector is connected to the input of the operational amplifier, which is sensitive, preferably the detector influence on the performance of the whole switched capacitor circuit should be minimized. The output of window comparator 72 may be fed to an adjustable bias circuit for controlling the bias level of an operation amplifier.

As noted previously, the settling time of an operational amplifier is basically determined by its bandwidth and slew rate that determines the current consumption (i.e., power) of the operation amplifier. By monitoring the settling time of the operational amplifiers at their inputs, the current consumption of the operational amplifiers may be lowered to a level where the settling time of the operational amplifiers are still adequate for maximum performance, but with the power consumption minimized. Since this embodiment of the present invention monitors each operational amplifier separately, it may be used in all kinds of switched capacitor circuits.

FIG. 6 shows a timing diagram of a power reduction circuit and operational amplifier according to an example embodiment of the present invention. The clock signal may include a phase A and a phase B. During phase A, the clock signal is at a high level, and during phase B, the clock signal is at a low level. The rising edge of a latch clock signal occurs during approximately the middle of phase B. The rising edge of phase A clocks the differential input signals to the operational amplifier. The latch clock signal may be generated by staging or delaying the clock signal.

The arrows denoted by 1, 2, 3 and 4 point to important points in the timing diagram. At the end of clock phase A, 1, the differences between the operational amplifier's inputs may be zero. This corresponds to a certain voltage level at node T in settling time detector 60. During phase B, window comparator 72 may be triggered by the rising edge of the latch signal, 2. The signal at node T (which corresponds to the difference between the operational amplifier's inputs) may be at this time within the window of comparator 72. This indicates adequate settling of the operational amplifier and, therefore, no error is generated at the output of comparator 72. The arrows 3 show where the signal at node T is outside the window of the comparator when the latch signal goes to a high level. Hence, the operational amplifier does not have adequate settling, therefore, indicating that the bias current supplied to the operational amplifier is too small. An error signal may be indicated on the output of comparator 72, 4, at the rising edge of the latch signal since node T is outside of the comparator window.

During sampling, the signal is charged to capacitors 52 and 54. During integration the charge is moved from capacitors 52 and 54 to capacitors 56 and 58. The time takes for the charge to move depends on the operational amplifier and how much current can be drawn from the operation amplifier. This is based on the bias current. The inverting and non-inverting inputs of the operational amplifier are monitored for a full clock phase. At the end of the clock phase, the voltage difference between the two inputs should be zero. During the next clock phase, phase B, the output voltage of the differential stage is compared in the window comparator 72 with the voltage held from the previous clock phase. Window comparator 72 is triggered approximately half way into clock phase B. If the output voltage of differential stage 70 is outside the comparators' windows, which means that the operational amplifier has not settled, an error code may be fed to adjustable bias logic 62. This comparison may be made for several clock cycles for each bias current level. If any error codes appear during these cycles, the operational amplifier has failed to settle, and the previous bias current level may be set for that specific operational amplifier.

The bias adjustment sequence may start with a full bias current level and go down one step at a time from there. The adjustment sequence may be made at any time and only may take tens or hundreds of clock cycles per operational amplifier. The power reduction device 68 may be powered down and disconnected from the inputs of operational amplifier 50 when power reduction device 68 is not in use. Phase B may also be known as the integration phase since this is when capacitors 56 and 58 are charging. For a double sample switched capacitor circuit, it may not matter during which clock phase the comparison is made. This is due to the fact that both sampling and integration may be made during both clock phases. For a conventional switched capacitor circuit, preferably the comparison is made during the integration phase.

This embodiment of the present invention is advantageous over the first embodiment of the present invention in that this embodiment monitors the settling of the operational amplifiers instead of the digital output. In the first embodiment, when decreasing the bias currents for the operational amplifiers, the operational amplifiers may fail the settling requirement much before this can clearly be seen in the digital output code monitored in the first embodiment. Therefore, the second embodiment of the present invention guarantees full performance of a switched capacitor circuit for all kinds of input signals.

All embodiments of the present invention are advantageous in that the current consumption in each operational amplifier may be separately optimized. Moreover, the present invention provides a more reliable method of adjusting the bias currents for operational amplifiers. Therefore, operational amplifiers, and consequently the switched capacitor circuit including the operational amplifiers, operate at much lower current levels. This allows battery operated devices using switched capacitor circuits, such as mobile phones, to last for much longer. Therefore, mobile phones or any other devices that contain switched capacitor circuits may operate at lower power, therefore, allowing them to operate for a longer period of time. This prolongs the battery life of these devices.

It is noted that the foregoing examples have been provided merely for the purpose of explanation and are in no way to be construed as limiting of the present invention. While the present invention has been described with reference to a preferred embodiment, it is understood that the words that have been used herein are words of description and illustration, rather than words of limitation. Changes may be made within the purview of the appended claims, as presently stated and as amended, without departing from the scope and spirit of the present invention in its aspects. Although the present invention has been described herein with reference to particular methods, materials, and embodiments, the present invention is not intended to be limited to the particulars disclosed herein, rather, the present invention extends to all functionally equivalent structures, methods and uses, such as are within the scope of the appended claims.

What is claimed is:

1. A power reduction device for a switched capacitor circuit comprising:

a detector, the detector being connected to both inputs of an operational amplifier in a switched capacitor circuit, the detector monitoring the inputs during each clock phase, storing a voltage difference between the inputs, and comparing the voltage difference stored with a voltage range to determine if the voltage difference is within the voltage range; and a controller, the controller being connected to an output signal of the detector, the controller adjusting a bias current of the operational amplifier based on the output signal, the bias current being adjusted to as low as possible but just above a value where the comparison falls outside the voltage range, wherein the power consumption of the operational amplifier is minimized while a settling time of the operational amplifier is still adequate for maximum performance.

2. The device according to claim 1, wherein the detector includes a differential stage with high impedance inputs, the inputs of the differential stage being connected to the inputs of the operational amplifier.

3. The device according to claim 1, wherein the detector includes a track and hold circuit, the track and hold circuit storing the voltage difference between the inputs of the operational amplifier.

4. The device according to claim 1, wherein the detector includes a window comparator.

5. The device according to claim 1, wherein the switched capacitor circuit comprises a modulator.

6. The device according to claim 5, wherein the modulator comprises a delta sigma modulator.

7. The device according to claim 1, wherein the switched capacitor circuit comprises filter.

8. The device according to claim 1, wherein the switched capacitor circuit comprises of one of an analog-to-digital converter (ADC) and a digital-to-analog converter (DAC).

9. The device according to claim 1, wherein the output signal comprises an error signal, the error signal becoming active whenever the detector detects that the comparison has fallen outside the desired range.

10. A method for power reduction in a switched capacitor circuit comprising:

applying a full bias current level to an operational amplifier;

monitoring a settling time of the operational amplifier at the inputs of the operational amplifier;

determining if a voltage difference between the inputs is above a threshold;

lowering the bias current level for the operational amplifier if the voltage difference between the inputs is below the threshold;

repeating the monitoring, determining, and lowering until the voltage difference between the inputs is above the threshold; and setting the bias current level to a previous bias current level before the bias current level where the voltage difference between the inputs is above the threshold, wherein the power consumption of the operational amplifier is minimized while the settling time of the operational amplifier is still adequate for maximum performance.

11. The method according to claim 10, further comprising optimizing the performance of all operational amplifiers in the switched capacitor circuit by performing the applying, monitoring, determining, lowering, repeating, and setting on all operational amplifiers in the switched capacitor circuit.

12. The method according to claim 10, further comprising storing the voltage difference between the inputs and using this as the threshold for the next voltage difference monitored between the inputs.

13. The method according to claim 10, further comprising performing the monitoring during a first phase of a two phase clock and performing the determining and lowering during a second phase of the two phase clock.

14. The method according to claim 13, further comprising performing the determining midway through the second phase of the two phase clock.

15. The method according to claim 10, further comprising generating an error signal when the voltage difference between the inputs is above the threshold.

16. The method according to claim 15, further comprising raising the bias current level for the operational amplifier in response to the error signal.

17. A power reduction device for a switched capacitor circuit comprising:

a counter, the counter monitoring output signals of a switched capacitor circuit;

bias control logic, the bias control logic controlling a bias current level of at least one operational amplifier in the switched capacitor circuit; and a controller, the controller operatively connected to the counter and the bias control logic, the controller sending signals instructing the bias control logic to one of increase and decrease the bias level current to the at least one operational amplifier based on the accuracy of the monitored output signals, wherein the power consumption of the operational amplifier is minimized while maintaining maximum performance from the operational amplifier.

18. The device according to claim 17, wherein the bias control logic controls a bias current level of at least one operational amplifier in at least one other switched capacitor circuit, the bias current level of the at least one operational amplifier in the at least one other switched capacitor circuit being set to a same level as the at least one operational amplifier in the switched capacitor circuit.

19. A method for power reduction in a switched capacitor circuit comprising:

monitoring an output of the switched capacitor circuit;

controlling a bias current level of at least one operational amplifier in the switched capacitor circuit; and one of increasing and decreasing the bias level current to the at least one operational amplifier based on the accuracy of the monitored output signal, wherein the power consumption of the operational amplifier is minimized while maintaining maximum performance from the operational amplifier.

20. The method according to claim 19, further comprising controlling a bias current level of at least one operational amplifier in at least one other switched capacitor circuit, the bias current level of the at least one operational amplifier in the at least one other switched capacitor circuit being set to a same level as the at least one operational amplifier in the switched capacitor circuit.

* * * * *